(12) United States Patent
Christensen

(10) Patent No.: US 11,758,678 B2
(45) Date of Patent: Sep. 12, 2023

(54) COMPUTING CARD SUPPORT SYSTEM FOR AN INFORMATION HANDLING SYSTEM

(71) Applicant: Dell Products L.P., Round Rock, TX (US)

(72) Inventor: Steven Christensen, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 121 days.

(21) Appl. No.: 17/445,116

(22) Filed: Aug. 16, 2021

(65) Prior Publication Data

US 2023/0048850 A1 Feb. 16, 2023

(51) Int. Cl.
*H05K 7/14* (2006.01)
*H05K 5/03* (2006.01)
*G06F 1/18* (2006.01)

(52) U.S. Cl.
CPC .......... *H05K 7/1424* (2013.01); *G06F 1/183* (2013.01); *H05K 5/03* (2013.01)

(58) Field of Classification Search
CPC ......... H05K 7/1424; H05K 5/03; G06F 1/183
See application file for complete search history.

(56) References Cited

U.S. PATENT DOCUMENTS

| | | | | |
|---|---|---|---|---|
| 4,124,878 A * | 11/1978 | Ebner | ................... | H05K 7/1424 361/756 |
| 5,338,214 A * | 8/1994 | Steffes | .................... | G06F 1/186 439/928 |
| 5,388,995 A * | 2/1995 | Rudy, Jr. | ............ | H01R 13/6596 361/730 |
| 6,256,205 B1 * | 7/2001 | Perry | .................... | H05K 7/1424 361/752 |
| 6,313,997 B1 * | 11/2001 | Speraw | ................ | H05K 7/1424 361/740 |
| 6,958,916 B2 * | 10/2005 | Roesner | ............... | H05K 7/1424 361/728 |
| 7,075,796 B1 * | 7/2006 | Pritchett | .............. | H05K 7/1408 361/756 |
| 7,277,296 B2 * | 10/2007 | Ice | ........................ | H05K 7/1418 361/756 |
| 7,335,032 B1 * | 2/2008 | Lee | ....................... | H05K 7/1405 439/76.1 |

(Continued)

*Primary Examiner* — Abhishek M Rathod
*Assistant Examiner* — Keith DePew
(74) *Attorney, Agent, or Firm* — McDermott Will & Emery LLP

(57) ABSTRACT

A computing card support system, including: a cage positioned on a PCB, including: a first support structure; a second support structure; a cover that is removably coupled to the support structures and positioned opposite to the PCB, the cover including a grounding material positioned along an inner surface of the cover, the inner surface of the cover facing the PCB; computing cards that are i) coupled to the PCB at a first end of each respective computing card and ii) positioned within the cage, each of the computing cards including conductive pads positioned at a second end opposite to the first end of the respective computing card, wherein the computing cards extend from the PCB toward the cover such that the grounding material of the cover is in contact with the conductive pads of each of the computing cards to provide electrical grounding of the computing cards.

14 Claims, 8 Drawing Sheets

(56) References Cited

U.S. PATENT DOCUMENTS

| | | | |
|---|---|---|---|
| 7,692,932 B2* | 4/2010 | Bisbikis | H05K 9/0062 |
| | | | 174/355 |
| 7,894,210 B1* | 2/2011 | Searby | H05K 7/1424 |
| | | | 361/752 |
| 9,655,270 B2* | 5/2017 | Kimata | H05K 9/0062 |
| 10,622,025 B2* | 4/2020 | Gopalakrishna | H05K 7/1488 |
| 2005/0068754 A1* | 3/2005 | Corrado | H05K 7/1454 |
| | | | 361/788 |

* cited by examiner

COMPUTING CARD SUPPORT SYSTEM FOR AN INFORMATION HANDLING SYSTEM

BACKGROUND

Field of the Disclosure

The disclosure relates generally to an information handling system, and in particular, a computing card support system for an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Storage and communication device computing cards implementation with information handling systems has been driven primarily by integration with mobile platforms. Thus, connectors have been designed to be low-profile and parallel to the board of the mobile platform. Airflow along circuit boards can be limited, thus such computing cards often require thermal conducting pads or heat sinks to dissipate heat when placed in areas with stagnant or insufficient airflow in desktop platforms.

SUMMARY

Innovative aspects of the subject matter described in this specification may be embodied in a computing card support system, including a cage positioned on a printed circuit board (PCB), including: a first support structure; a second support structure spaced-apart from the first support structure; a cover that is removably coupled to the first support structure and the second support structure and positioned opposite to the PCB, the cover including a grounding material positioned along an inner surface of the cover, the inner surface of the cover facing the PCB; and a plurality of computing cards that are i) coupled to the PCB at a first end of each respective computing card and ii) positioned within the cage, each of the computing cards including conductive pads positioned at a second end opposite to the first end of the respective computing card, wherein the computing cards extend from the PCB toward the cover such that the grounding material of the cover is in contact with the conductive pads of each of the computing cards to provide electrical grounding of the computing cards.

Other embodiments of these aspects include corresponding systems and apparatus.

These and other embodiments may each optionally include one or more of the following features. For instance, the first and the second support structures include respective windows. The cage further includes a first guard rail positioned between the first and the second support structures at a first side of the cage, and a second guard rail positioned between the first and the second support structures at a second side of the cage, the first side opposite to the second side. The cage further includes a slat positioned between the first and the second guard rail. The slat includes the grounding material positioned along an inner surface of the slat, the inner surface of the slat facing the PCB. The computing card support system further including an additional computing card that is i) coupled to the PCB at a first end of the additional computing card and ii) positioned within the cage, the additional computing card including a conductive pad positioned at a second end opposite to the first end of the additional computing card, wherein the additional computing card extends from the PCB towards the slat such that the grounding material of the slat is in contact with the conductive pad of the additional computing card to provide electrical grounding of the additional computing card. The first support structure includes an opening and the cover includes a protrusion such that when the cover is coupled to the first support structure the protrusion is at least partially positioned within the opening. The second support structure includes a protrusion and the cover includes an opening such that when the cover is coupled to the second support structure the protrusion is at least partially positioned within the opening. The conductive pads of the computing cards are positioned at one or more corners of the respective computing card, and wherein the grounding material of the cover is positioned on the inner surface of the cover that corresponds to the corners of the respective computing cards. The conductive pads of the computing cards are positioned between edges of the respective computing cards, and wherein the grounding material of the cover is positioned on the inner surface of the cover that corresponds to the positioning of the conductive pads between the edges of the computing cards. The cage further includes a plurality of guides that correspond for respective computing cards, wherein, for each computing card, the guide includes a ground clip in contact with the computing card.

Particular implementations of the subject matter described in this specification can be implemented so as to realize one or more of the following advantages. For example, vertical connectors can provide improved cooling while utilizing less board space. Thus, efficient use of board space is obtained, reducing board space size, and chassis sizes. Further, the need for thermal hardware (pads, heatsinks) is reduced.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

Figure 1:
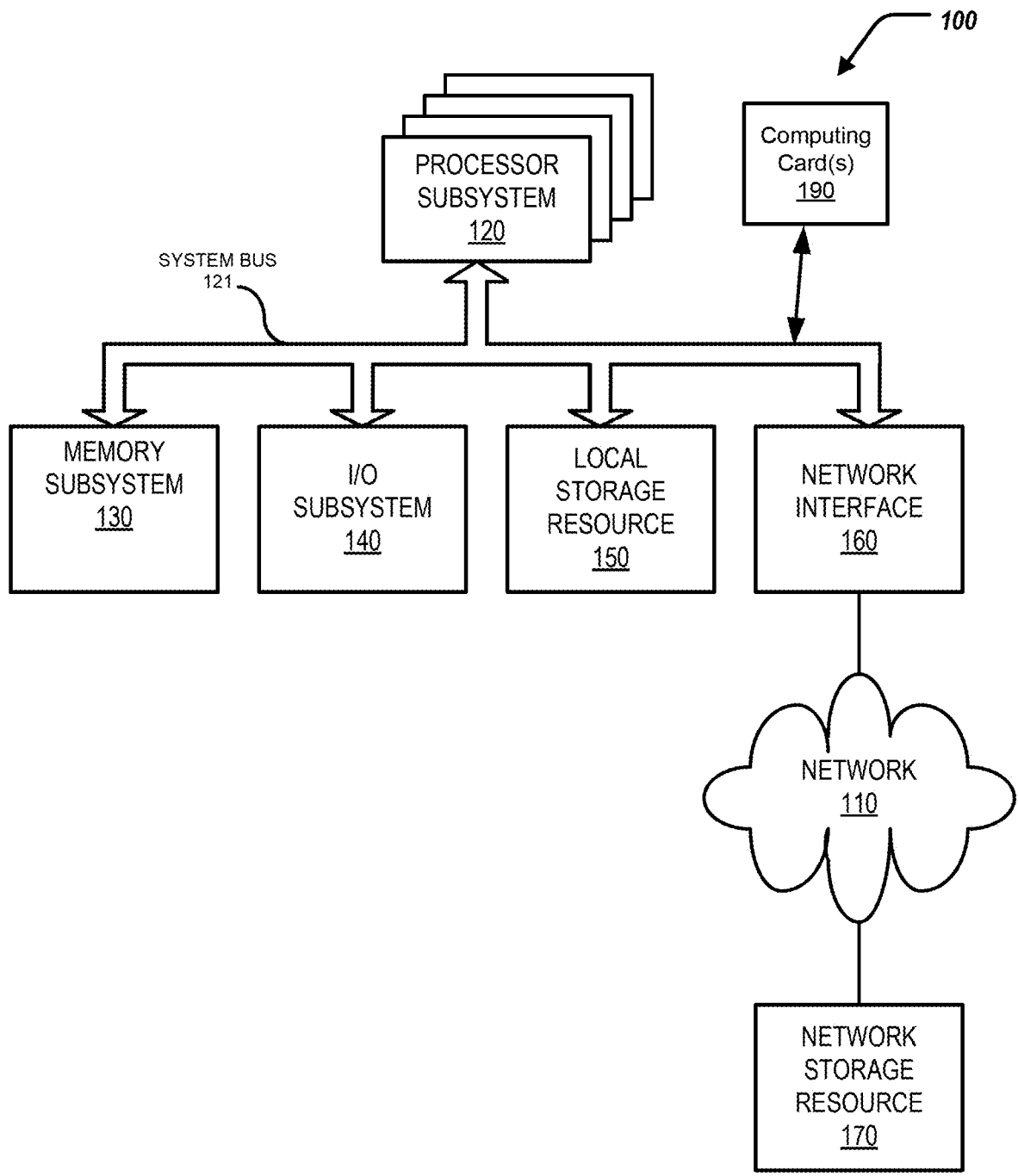
FIG. 1 is a block diagram of selected elements of an embodiment of an information handling system.

This disclosure discusses a computing card support system for an information handling system. In short, using a vertical connector interface on a printed circuit board of the information handling system, computing cards can be arranged in a parallel configuration to reduce "real-estate" usage of the computing cards on the printed circuit board.

Specifically, this disclosure discusses a computing card support system, comprising: a cage positioned on a printed circuit board (PCB), including: a first support structure; a second support structure spaced-apart from the first support structure; a cover that is removably coupled to the first support structure and the second support structure and positioned opposite to the PCB, the cover including a grounding material positioned along an inner surface of the cover, the inner surface of the cover facing the PCB; and a plurality of computing cards that are i) coupled to the PCB at a first end of each respective computing card and ii) positioned within the cage, each of the computing cards including conductive pads positioned at a second end opposite to the first end of the respective computing card, wherein the computing cards extend from the PCB toward the cover such that the grounding material of the cover is in contact with the conductive pads of each of the computing cards to provide electrical grounding of the computing cards.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-9 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

The information handling system 100 can also include computing cards 190, e.g., solid-state drives (SSD) or M.2 computing cards.

In short, using a vertical connector interface on a printed circuit board of the information handling system 100, the computing cards 190 can be arranged in a parallel configuration to reduce "real-estate" usage of the computing cards 190 on the printed circuit board.

Figure 2:
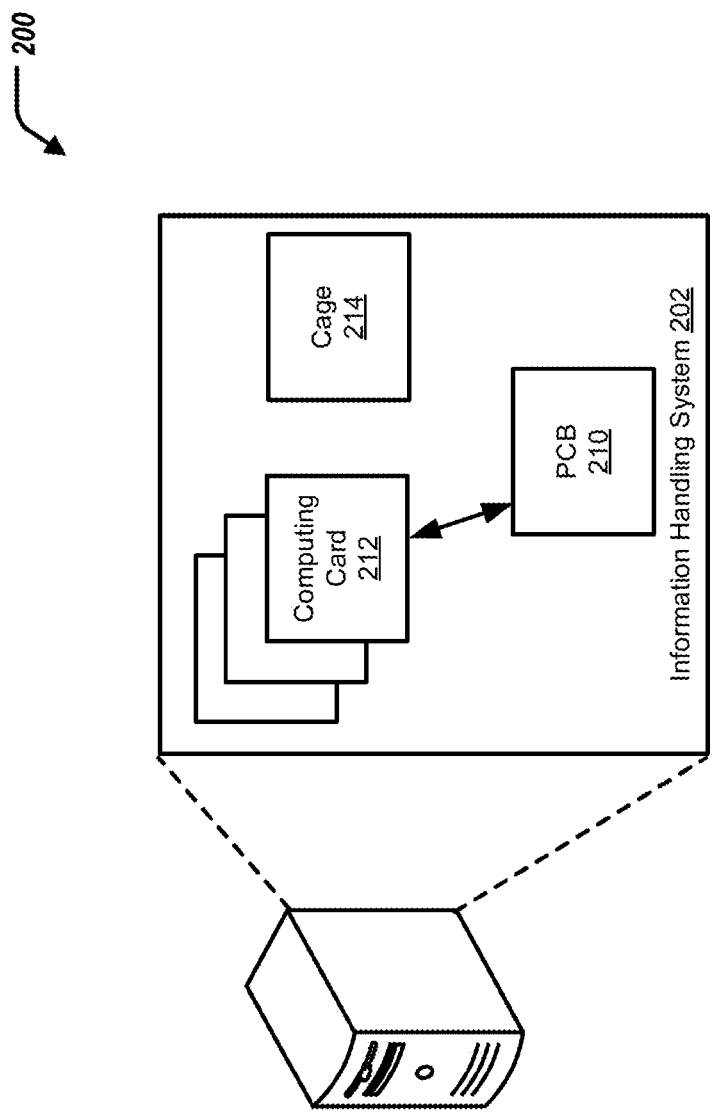
FIG. 2 illustrates a block diagram of an information handling system.

Turning to FIG. 2, FIG. 2 illustrates an environment 200 including an information handling system 202. The information handling system 202 can include a printed circuit board (PCB) 210, computing cards 212, and a cage 214. In some examples, the information handling system 202 is similar to, or includes, the information handling system 100 of FIG. 1.

The computing cards 212 can be coupled to the PCB 210. In some examples, the computing cards 212 are similar to, or includes, the computing cards 190 of FIG. 1.

The PCB 210 can be any type of circuit board, including a motherboard or a midplane. The computing cards 212 can be any type of computing card, including solid-state drives (SSD) or M.2 computing cards. The computing cards 212 can be of various sizes (e.g., 2230 and/or 2280). The cage 214 can facilitate coupling of the computing cards 212 to the PCB 210, and electrically grounding of the computing cards 212 to the PCB 210, described further herein.

FIGS. 3A-3D illustrate a computing card support system 302. The computing card support system 302 includes the computing cards 212 and the cage 214. The cage 214 can be positioned on (coupled to) the PCB 210. In short, the cage 214 can surround the computing cards 212 to provide structural support, retention, and electrically ground to the computing cards 212.

The cage 214 can include a first support structure 216a and a second support structure 216b (collectively referred to as support structures 216). The second support structure 216b can be spaced-apart from the first support structure 216a. The first support structure 216a and the second support structure 216b can be connected by a connecting member 217. The support structures 216 can be coupled to the PCB 210 (e.g., using a fastener). The first support structure 216a can include a first window 218a (shown in FIG. 3C), and the second support structure 216b can include a second window 218*b* (collectively referred to as windows 218). The windows 218 can facilitate movement/passage of airflow of cooling of the computing cards 212.

Figure 3B:
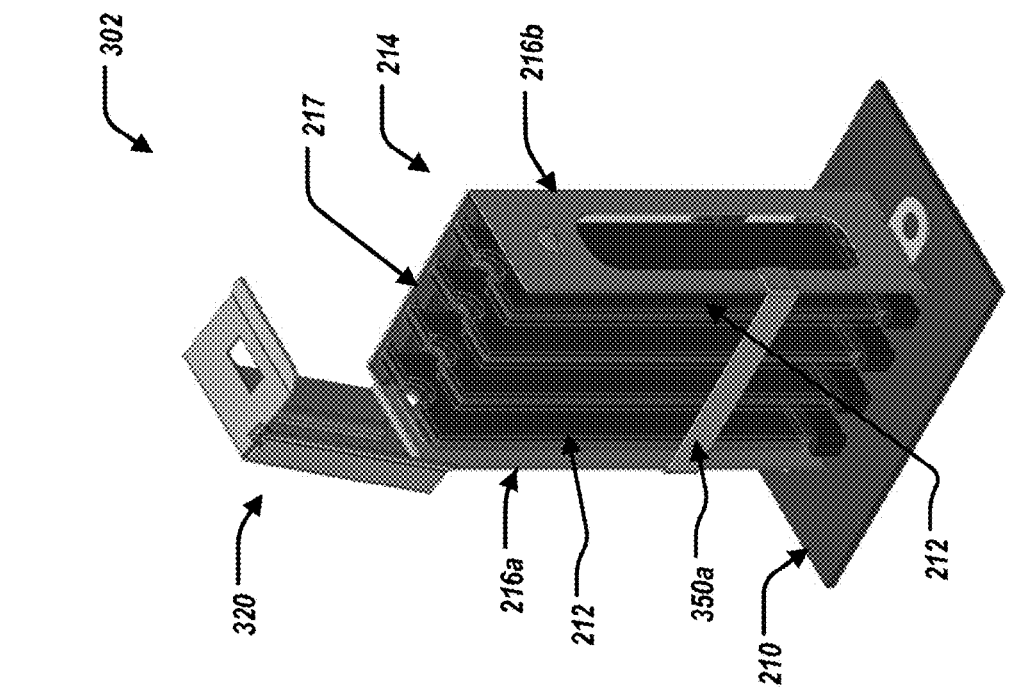
FIGS. 3A-3D illustrating the computing card support system of the information handling system.
Figure 3A:
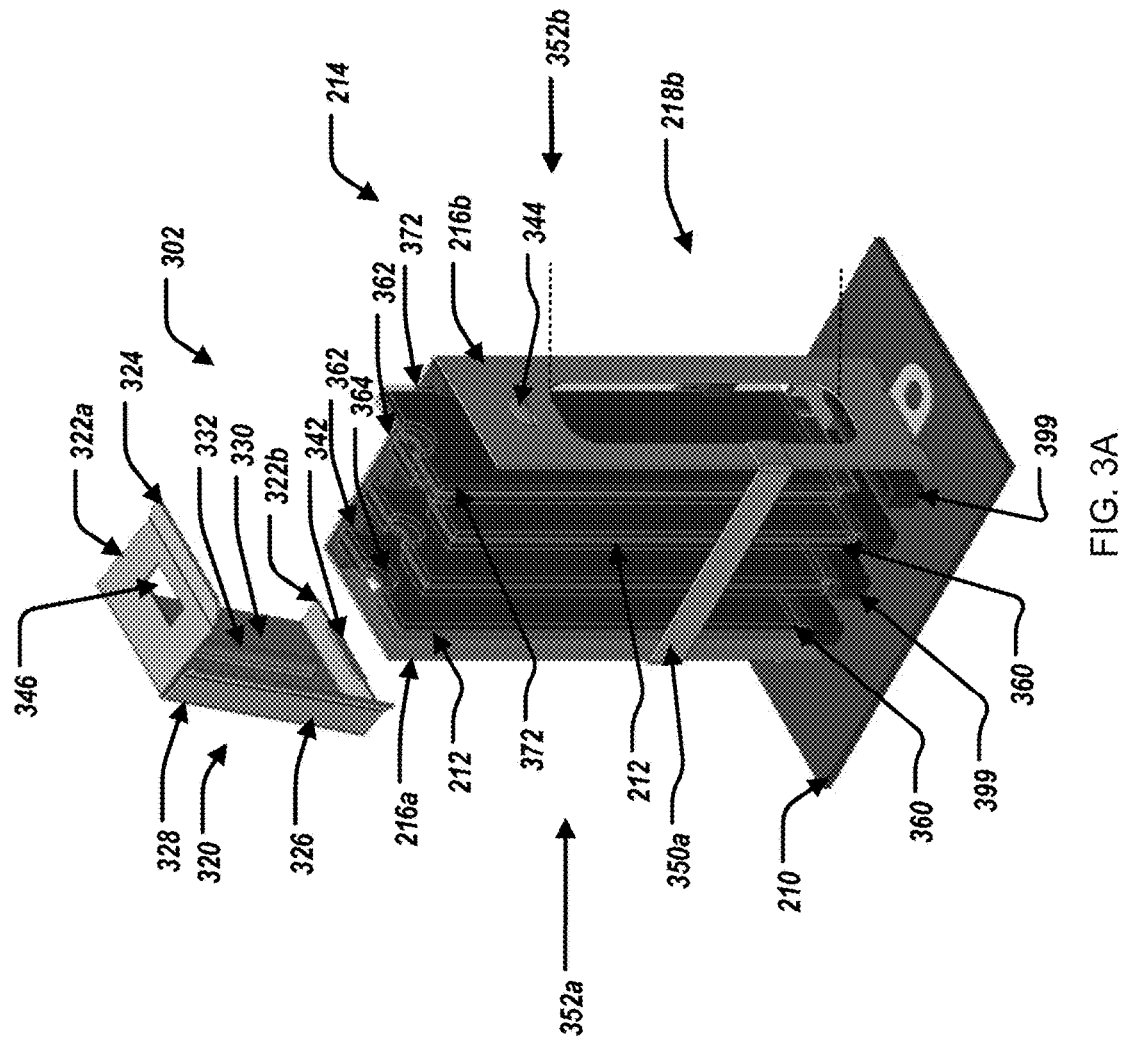
Figures 3C, 3D:
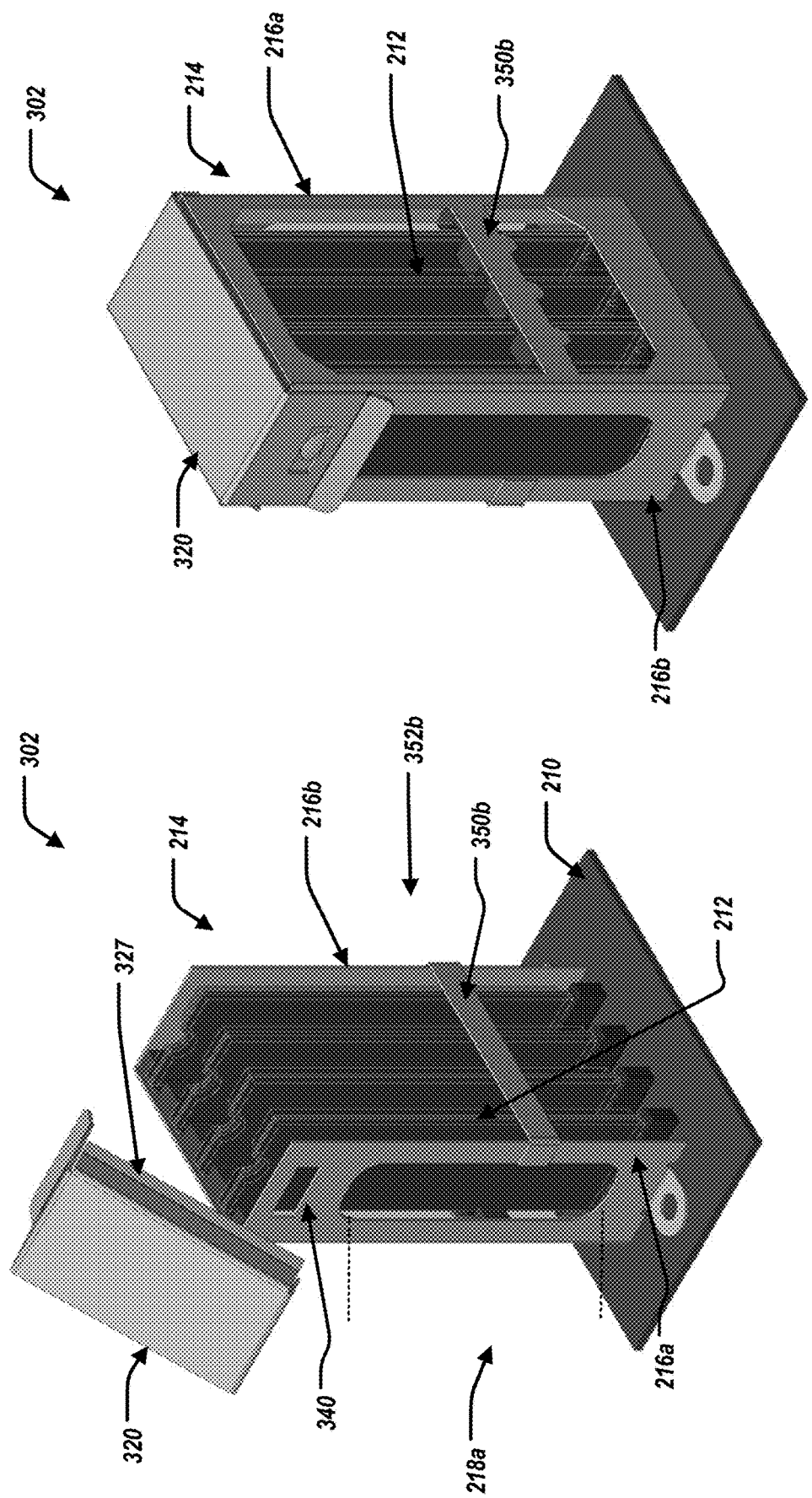

The cage 214 can further include a cover 320. The cover 320 can be removably coupled to the support structures 216. The cover 320 can include a first flap 322*a* and a second flap 322*b* positioned opposite to the first flap 322*a*. In some examples, the first flap 322*a* can further include a flange 324. The cover 320 can further include a third flap 326 positioned between the first and the second flaps 322*a*, 322*b*. The cover 320 can further include a fourth flap 327 positioned between the first and the second flaps 322*a*, 322*b*, as shown in FIG. 3C. The cover 320 can further include an outer surface 328 and an inner surface 330. The inner surface 330 can be positioned opposite to the outer surface 328.

The cover 320 can further include a grounding material 332. The grounding material 332 can be positioned along the inner surface 330. In some examples, the grounding material 332 can extend (partially, wholly, or substantially) between the first flap 322*a* and the second flap 322*b*. In some examples, the grounding material 322 can include a very low durometer conductive elastomer, a wire mesh, and/or coiled or plate springs. In some examples, the grounding material 322 includes a fabric over foam and/or ultra-soft electrically conductive elastomers (ECE).

When the cover 320 is coupled to the support structures 216, the cover 320 is positioned opposite to the PCB 210, as shown in FIG. 3D. Furthermore, when the cover 320 is coupled to the support structures 216, the inner surface 330 faces the PCB 210.

To that end, when the cover 320 is coupled to the support structures 216, the cover 320 and the cage 214 can retain the computing cards 212 within the cage 214. In other words, the cover 320 can be considered a "single tool-less" cover that retains the computing cards 212.

Specifically, the cover 320 can be coupled to the support structures 216 independent of (i.e., without) fasteners between the cover 320 and the support structures 216. In some examples, the first support structure 216*a* can include an opening 340, as shown in FIG. 3C; and the cover 320 can include a protrusion 342. When the cover 320 is coupled to the first support structure 216*a*, the protrusion 342 can be at least partially positioned within the opening 340. Furthermore, in some examples, the second support structure 216*b* can include a protrusion 344; and the cover 320 can include an opening 346. When the cover 320 is coupled to the second support structure 216*b*, the protrusions 344 can be at least partially positioned within the opening 346.

The cage 214 can further include a first guard rail 350*a* positioned between the support structures 216 at a first side 352*a*. The cage 214 can further include a second guard rail 350*b* positioned between the support structures 216 at a second side 352*b*. The first side 352*a* is opposite to the second side 352*b*. The guard rails 350*a*, 350*b* can facilitate retaining the computing cards 212 within the cage 214.

The computing cards 212 can include a first end 360 positioned opposite to a second end 362. The computing cards 212 can be coupled to the PCB 210 at the first end 360 of the respective computing cards 212 (at connectors 399). Further, the computing cards 212 can be positioned within the cage 214. Each of the computing cards 212 can include conductive pads 364 positioned at the second end 362 of the respective computing cards 212. The conductive pads 364 can be electrically conductive.

When the cover 320 is coupled to the first support structure 216*a*, as shown in FIG. 3D, the computing cards 212 extend from the PCB 210 towards the cover 320 such that the grounding material 332 of the cover 320 is in contact with the conductive pads 364 of each of the computing cards 212 to provide electrical grounding of the computing cards 212. Specifically, the grounding material 332 can provide a path to ground for the computing cards 212, e.g., from the grounding material 332 to the cover 320 to the support structures 216 to the PCB 210.

In some examples, the conductive pads 364 are positioned between edges 372 of the computing cards 212 of the respective computing cards 212. Further, the grounding material 332 of the cover 320 is positioned on the inner surface 330 of the cover 320 that corresponds to the positioning of the conductive pads 364 between the edges 372 of the computing cards 212. For example, when the conductive pads 364 are positioned in the "middle" of the computing card 212 (or substantially the "middle"), the grounding material 332 of the cover 320 is positioned on the inner surface 330 of the cover 320 that corresponds to the "middle" (or substantially the "middle") positioning of the conductive pads 364 on the computing cards 212.

Figure 4:
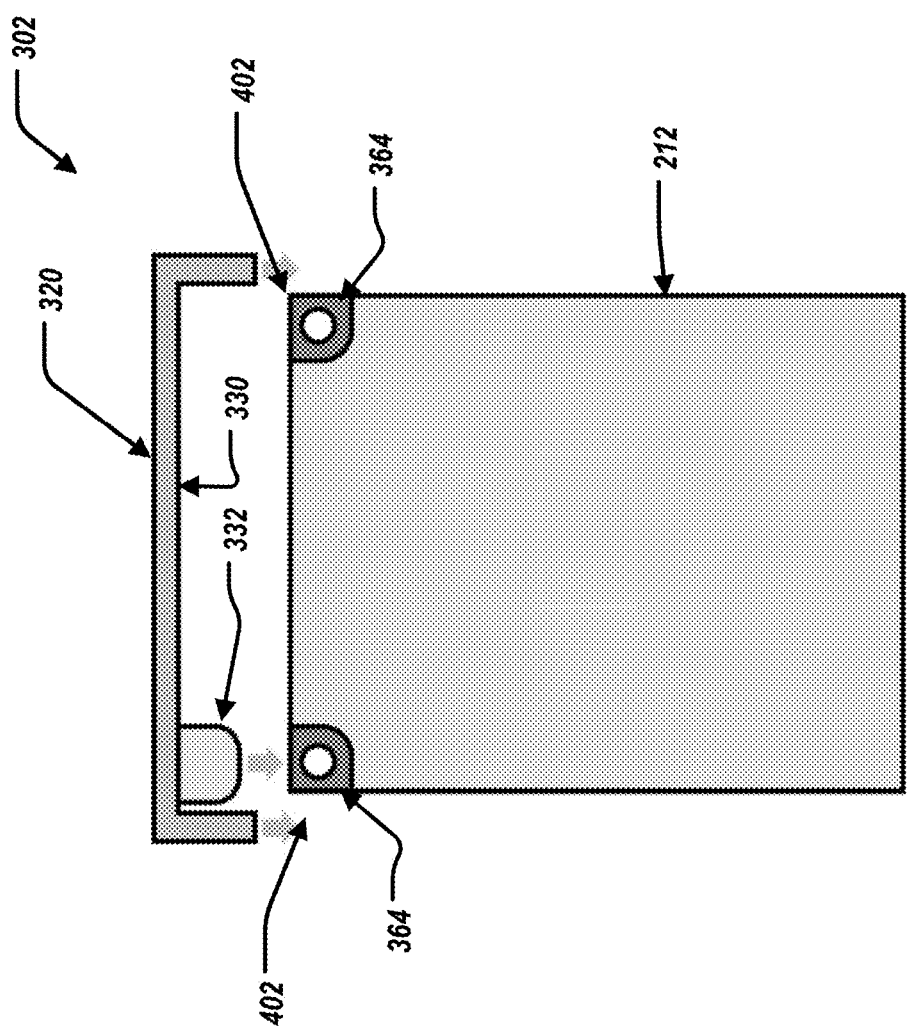
FIG. 4 illustrates the computing card support system, including conductive pads at a corner of the computing card.

FIG. 4 illustrates the computing card support system 302, including the conductive pads 364 of the computing card 212 at a corner of the computing card 212. Specifically, the conductive pads 364 are positioned at corners 402 of the respective computing cards 212. Further, the grounding material 332 of the cover 320 is positioned on the inner surface 330 of the cover 320 that corresponds to the positioning of the conductive pads 364 at the corners 402 of the computing cards 212. In some examples, the grounding material 332 only contacts the conductive pad 364 at one of the corners 402 of the respective computing cards 212 when the cover 320 is coupled to the support structure 216. In some examples, the cover 320 can include additional grounding material (not shown) such that the grounding material 332 contacts the conductive pad 364 at one of the corners 402 of the respective computing cards 212 and the additional grounding material (not shown) contacts the conducive pad 364 at the other corner 402 of the respective computing cards 212 when the cover 320 is coupled to the support structure 216.

Figure 5:
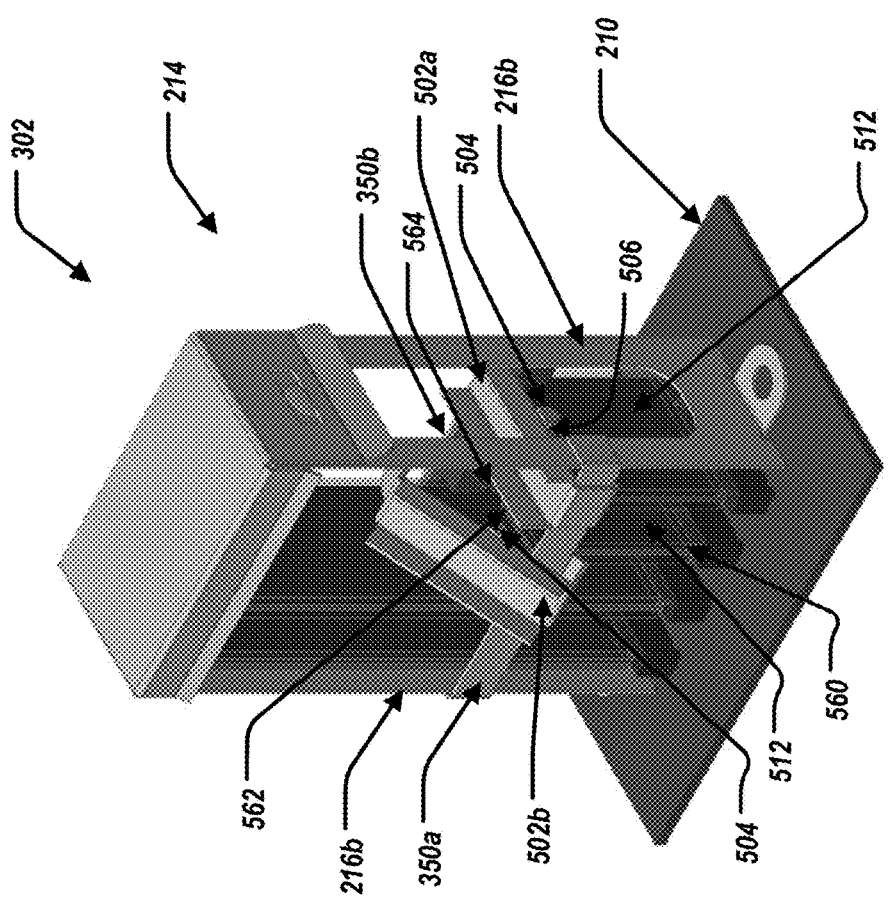
FIG. 5 illustrates the computing card support system, in a further implementation.

FIG. 5 illustrates the computing card support system 302, in a further implementation. Specifically, the cage 214 can further include a first slat 502*a* and a second slat 502*b* (collectively referred to as slats 502) positioned between the first guard rail 350*a* and the second guard rail 350*b*. In some examples, the slats 502 are removably coupled to the guard rails 350. The slats 502 can include grounding material 504, similar to the grounding material 332 of the cover 320. The grounding material 504 can be positioned along an inner surface 506 of the slats 502. The inner surface 506 of the slats 502 can face the PCB 210. In some examples, only one of the slats 502 includes the grounding material 504.

In some examples, the computing cards can have a differing height, shown as computing cards 512. The computing cards 512 can include a first end 560 positioned opposite to a second end 562. The computing cards 512 can be coupled to the PCB 210 at the first end 560 of the respective computing card 512. Further, the computing cards 512 can be positioned within the cage 214. Each of the computing cards 512 can include conductive pads 564 positioned at the second end 562 of the respective computing card 212. The conductive pads 564 can be electrically conductive.

When the cover 320 is coupled to the first support structure 216*a*, the computing cards 512 extend from the PCB 210 towards the slats 502 such that the grounding material 504 of the slats 502 is in contact with the conductive pads 564 of each of the computing cards 512 to provide electrical grounding of the computing cards 512. Specifically, the grounding material 504 can provide a path to ground for the computing cards 512, e.g., from the grounding material 504 to the slats 502, to the guard rails 350 to the support structures 216 to the PCB 210.

Figure 6:
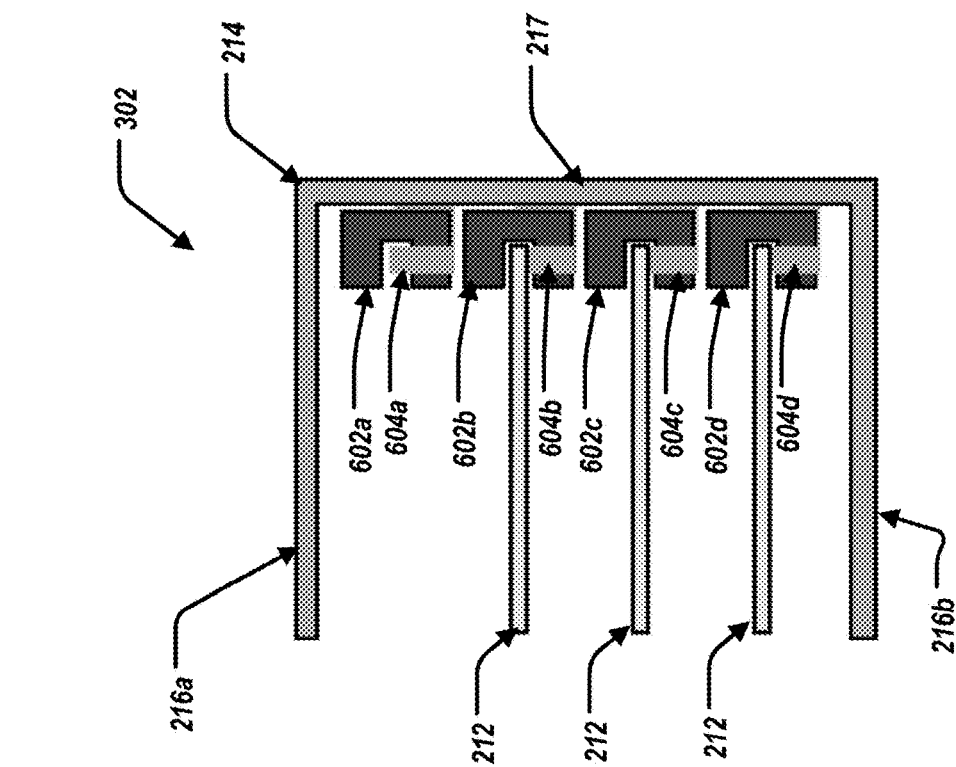
FIG. 6 illustrates the computing card support system, the cage including guides and ground clips.

FIG. 6 illustrates a top down view of the computing card support system 302 and the cage 214. Specifically, in some examples, the cage 214 can further include guides 602 (shown as guides 602a, 602b, 602c, 602d) positioned on (extending from) the connecting member 217. The guides 602 can correspond to respective computing cards 212. The guides 602 can further include clips 604 (shown as clips 604a, 604b, 604c, 604d). To that end, the guides 602 can facilitate holding and coupling of the computing cards 212 within the cage 214. For example, when the computing card 212 is inserted in the guide 602b, the clip 604b can be retracted within the guide 602b while also applying a force to the computing card 212 (e.g., a spring-loaded force) to maintain a desired position of the computing card 212 with respect to the guide 602b (and the cage 214) (similar for computing cards 212 with respect to guides 602c, 602d and clips 604c, 604d). That is, the clip 604b is in contact with the computing card 212 to hold the computing card 212 within the cage 214. Furthermore, the guides 602 and the clips 604 can provide a path to ground for the computing cards 212, e.g., from the clip 604 to the support structures 216 to the PCB 210.

Figure 7:
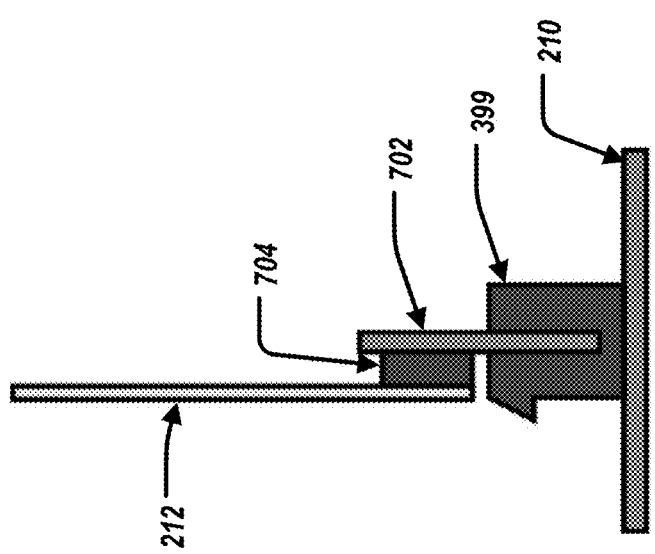
FIG. 7 illustrates the computing card support system, including a riser.

FIG. 7 illustrates the computing card support system 302, including a riser 702. Specifically, the riser 702 can facilitate supporting vertical orientation (with respect to the PCB 210) of the computing card 212. That is, the riser 702 can function as a bridge between the connector 399 (e.g., a high speed PCIe connector) and a connector 704 (e.g., a M.2 connect).

Figure 8:
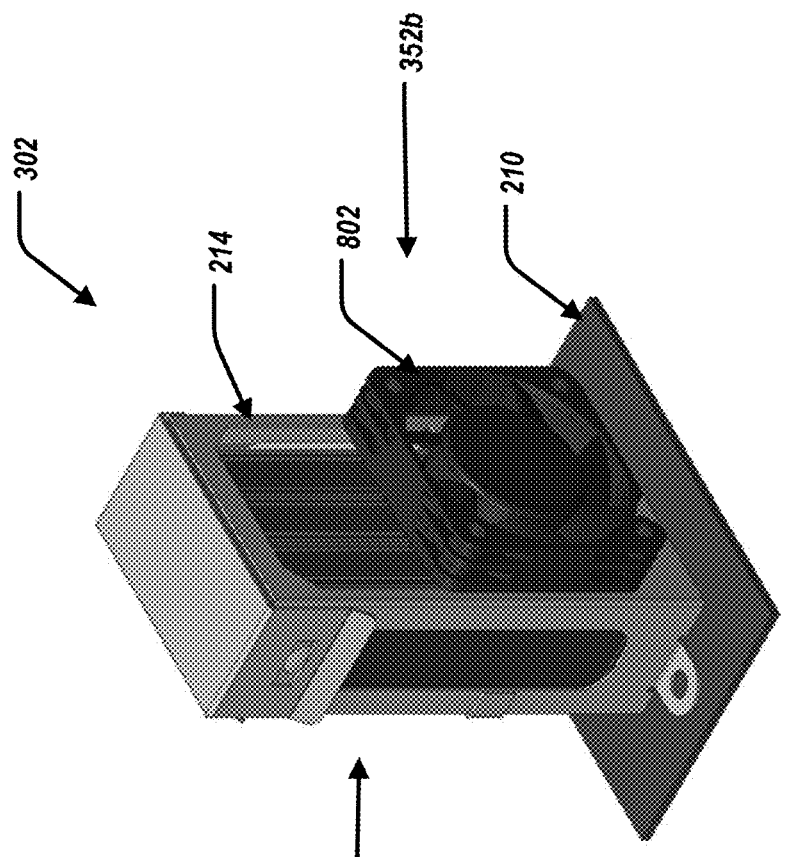
FIG. 8 illustrates the computing card support system, including a fan.

FIG. 8 illustrates the computing card support system 302, including a fan 802. The fan 802 can be positioned along the first side 352a and/or the second side 352b of the cage 214. The fan 802 can be coupled to the cage 214 and/or the PCB 210. In some examples, the system 302 can include any number of fans. The fan 802 can be positioned proximate to the computing cards 212 and/or the cage 214 to increase air flow and cooling of the computing cards 212

Figure 9A:
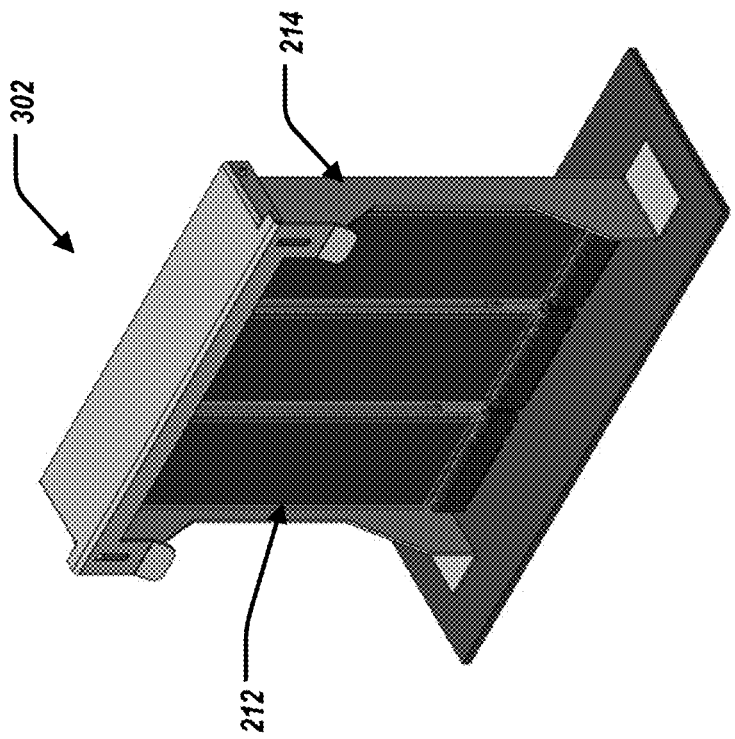
FIGS. 9A, 9B illustrate the computing card support system, in a further implementation.
Figure 9B:
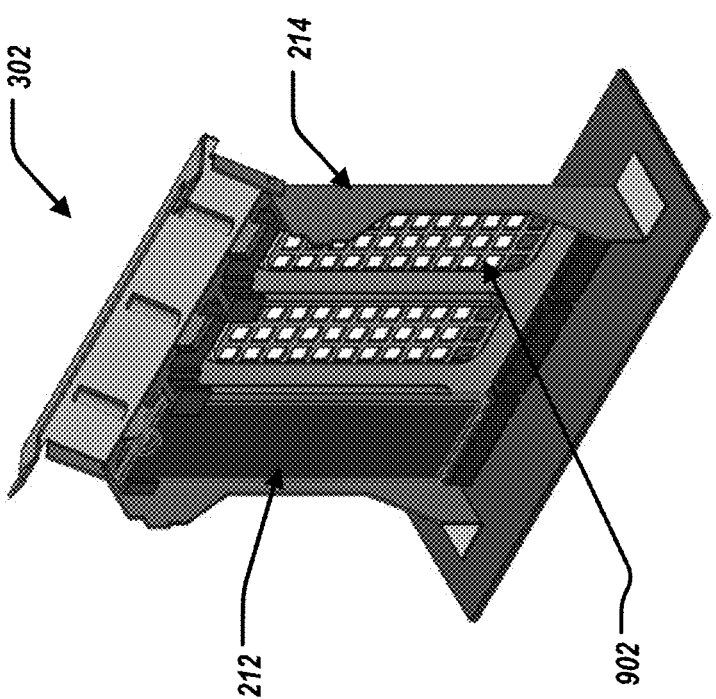

FIGS. 9A, 9B illustrate the computing card support system 302, in a further implementation. Specifically, the computing cards 212 can positioned in a co-planar arrangement (as opposed to the parallel arrangement of FIGS. 3A-3D). Furthermore, the cage 214 can further include vents 902 associated with each computing card 212 for additional airflow and air cooling of the computing cards 212. In some examples, the grounding material 332 can extend between the flaps 326, 327 that corresponds to the positioning of the conductive pads 364 of the computing cards 212.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A computing card support system, comprising:
   a cage positioned on a printed circuit board (PCB), including:
      a first support structure;
      a second support structure spaced-apart from the first support structure;
      a first guard rail positioned between the first and the second support structure at a first side of the cage;
      a second guard rail positioned between the first and the second support structure at a second side of the cage opposite to the first side;
      a slat positioned between the first and the second guard rail, the slat including a grounding material positioned along an inner surface of the slat facing the PCB;
      a cover that is removably coupled to the first support structure and the second support structure and positioned opposite to the PCB, the cover including the grounding material positioned along an inner surface of the cover, the inner surface of the cover facing the PCB; and
   a plurality of computing cards that are i) coupled to the PCB at a first end of each respective computing card and ii) positioned within the cage, each of the computing cards including conductive pads positioned at a second end opposite to the first end of the respective computing card,
   wherein a first computing card of the computing cards extend from the PCB toward the cover such that the grounding material of the cover is in contact with the conductive pad of the first computing card of the computing cards to provide electrical grounding of the first computing card of computing cards, the first computing card having a first height,
   wherein a second computing card of the computing cards extends from the PCB towards the slat such that the grounding material of the slat is in contact with the conductive pad of the second computing card to provide electrical grounding of the second computing card of the computing cards, the second computing card having a second height less than the first height of the first computing card.

2. The computing card support system of claim 1, wherein the first and the second support structures include respective windows.

3. The computing card support system of claim 1, wherein the first side of the cage is opposite to the second side of the cage.

4. The computing card support system of claim 1, wherein the first support structure includes an opening and the cover includes a protrusion such that when the cover is coupled to the first support structure the protrusion is at least partially positioned within the opening.

5. The computing card support system of claim 1, wherein the second support structure includes a protrusion and the cover includes an opening such that when the cover is coupled to the second support structure the protrusion is at least partially positioned within the opening.

6. The computing card support system of claim 1, wherein the conductive pads of the computing cards are positioned at one or more corners of the respective computing card, and wherein the grounding material of the cover is positioned on the inner surface of the cover that corresponds to the corners of the respective computing cards.

7. The computing card support system of claim 1, wherein the conductive pads of the computing cards are positioned between edges of the respective computing cards, and wherein the grounding material of the cover is positioned on the inner surface of the cover that corresponds to the positioning of the conductive pads between the edges of the computing cards.

8. The computing card support system of claim 1, wherein the cage further includes a plurality of guides that correspond for respective computing cards, wherein, for each computing card, the guide includes a ground clip in contact with the computing card.

9. An information handling system, comprising:
a processor;
memory media storing instructions executable by the processor to perform operations;
a computing card support system, comprising:
a cage positioned on a printed circuit board (PCB), including:
a first support structure;
a second support structure spaced-apart from the first support structure;
a first guard rail positioned between the first and the second support structure at a first side of the cage;
a second guard rail positioned between the first and the second support structure at a second side of the cage opposite to the first side;
a slat positioned between the first and the second guard rail, the slat including a grounding material positioned along an inner surface of the slat facing the PCB;
a cover that is removably coupled to the first support structure and the second support structure and positioned opposite to the PCB, the cover including the grounding material positioned along an inner surface of the cover, the inner surface of the cover facing the PCB; and
a plurality of computing cards that are i) coupled to the PCB at a first end of each respective computing card and ii) positioned within the cage, each of the computing cards including conductive pads positioned at a second end opposite to the first end of the respective computing card,
wherein a first computing card of the computing cards extends from the PCB toward the cover such that the grounding material of the cover is in contact with the conductive pad of the first computing card of the computing cards to provide electrical grounding of the first computing card of computing cards, the first computing card having a first height,
wherein a second computing card of the computing cards extends from the PCB towards the slat such that the grounding material of the slat is in contact with the conductive pad of the second computing card to provide electrical grounding of the second computing card of the computing cards, the second computing card having a second height less than the first height of the first computing card.

10. The information handling system of claim 9, wherein the first and the second support structures include respective windows.

11. The information handling system of claim 9, wherein the first side of the cage is opposite to the second side of the cage.

12. The information handling system of claim 9, wherein the first support structure includes an opening and the cover includes a protrusion such that when the cover is coupled to the first support structure the protrusion is at least partially positioned within the opening.

13. The information handling system of claim 9, wherein the second support structure includes a protrusion and the cover includes an opening such that when the cover is coupled to the second support structure the protrusion is at least partially positioned within the opening.

14. The information handling system of claim 9, wherein the conductive pads of the computing cards are positioned at one or more corners of the respective computing card, and wherein the grounding material of the cover is positioned on the inner surface of the cover that corresponds to the corners of the respective computing cards.

* * * * *